United States Patent
Shiobara et al.

(10) Patent No.: US 8,969,861 B2
(45) Date of Patent: Mar. 3, 2015

(54) METHOD OF MANUFACTURING ORGANIC ELECTROLUMINESCENCE DISPLAY DEVICE

(71) Applicant: Canon Kabushiki Kaisha, Tokyo (JP)

(72) Inventors: Satoru Shiobara, Funabashi (JP); Manabu Otsuka, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 71 days.

(21) Appl. No.: 13/913,836

(22) Filed: Jun. 10, 2013

(65) Prior Publication Data
US 2014/0001452 A1    Jan. 2, 2014

(30) Foreign Application Priority Data
Jun. 29, 2012 (JP) .................. 2012-147948

(51) Int. Cl.
*H01L 29/08* (2006.01)
*H01L 51/50* (2006.01)

(52) U.S. Cl.
CPC .................. *H01L 51/5012* (2013.01)
USPC ............................. 257/40; 438/34

(58) Field of Classification Search
CPC ................ H01L 51/0018; H01L 51/5012
USPC ................... 257/40, 642–643, 759, 257/E51.001–E51.052, E25.008–E25.009; 438/29, 34, 69, 82, 99
See application file for complete search history.

(56) References Cited

U.S. PATENT DOCUMENTS

| | | | |
|---|---|---|---|
| 6,617,186 B2 | 9/2003 | Kashiwabara | |
| 7,220,998 B2 | 5/2007 | Kashiwabara | |
| 7,534,557 B2 | 5/2009 | Tachikawa et al. | |
| 7,615,388 B2 | 11/2009 | Kashiwabara | |
| 7,718,352 B2 | 5/2010 | Tachikawa et al. | |
| 7,914,976 B2 | 3/2011 | Tachikawa et al. | |
| 8,021,203 B2 | 9/2011 | Kashiwabara | |
| 2011/0053313 A1* | 3/2011 | Tomino et al. | 438/99 |
| 2012/0034735 A1* | 2/2012 | Lee et al. | 438/99 |
| 2012/0252143 A1 | 10/2012 | Otsuka et al. | |
| 2012/0274239 A1* | 11/2012 | Endo et al. | 315/312 |
| 2012/0274807 A1 | 11/2012 | Shiobara et al. | |

FOREIGN PATENT DOCUMENTS

| | | |
|---|---|---|
| JP | 3839276 B2 | 11/2006 |
| JP | 4507759 B2 | 7/2010 |
| JP | 4544811 B2 | 9/2010 |
| JP | 4736923 B2 | 7/2011 |

* cited by examiner

*Primary Examiner* — Armando Rodriguez
*Assistant Examiner* — Mohammed R Alam
(74) *Attorney, Agent, or Firm* — Fitzpatrick, Cella, Harper & Scinto

(57) ABSTRACT

The method of manufacturing an organic electroluminescence display device includes the steps of: forming an organic compound layer on a first electrode; forming a sacrificial layer soluble in a polar solvent on the organic compound layer; forming an intermediate layer formed of a water-soluble polymer on the sacrificial layer; patterning the sacrificial layer, the intermediate layer, and the organic compound layer; removing the intermediate layer and a layer formed thereon; and removing the sacrificial layer, in which the step of removing the sacrificial layer includes a step of performing a contacting step of bringing the sacrificial layer and the polar solvent into contact with each other a plurality of times.

6 Claims, 10 Drawing Sheets

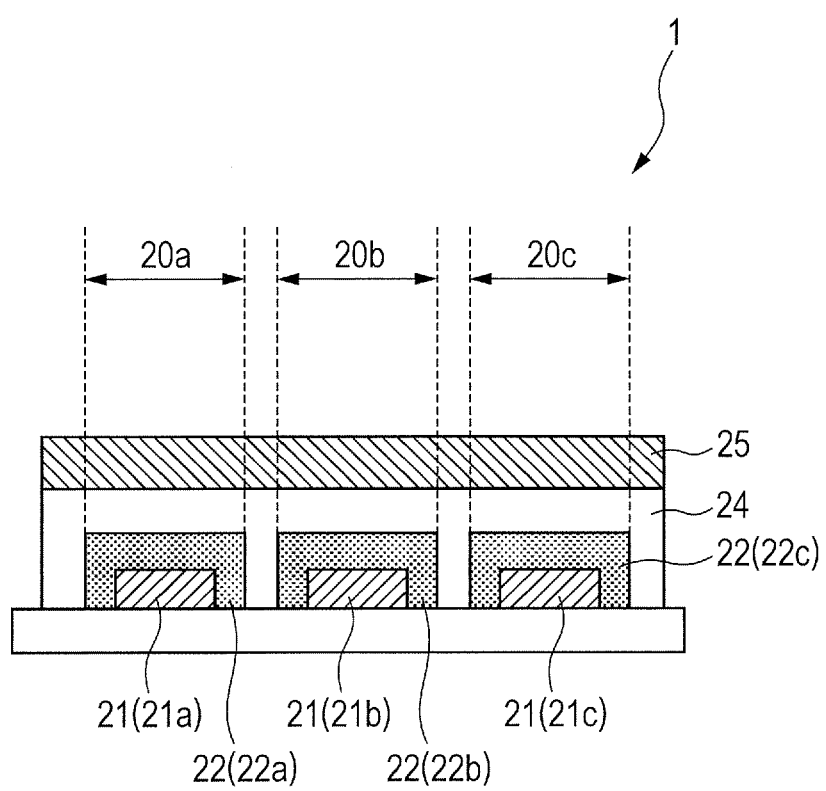

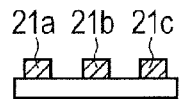
FIG. 2A
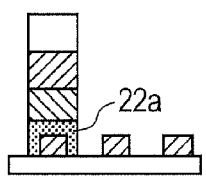
FIG. 2G
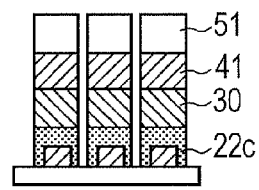
FIG. 2K
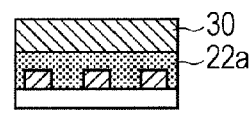
FIG. 2B
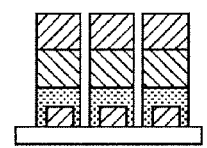
FIG. 2L
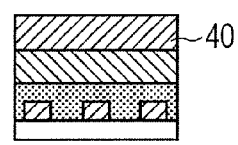
FIG. 2C
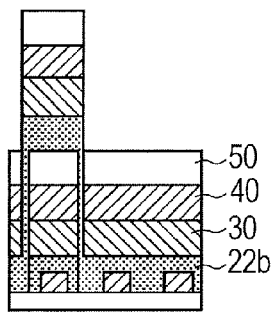
FIG. 2H
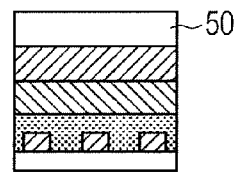
FIG. 2D
FIG. 2M
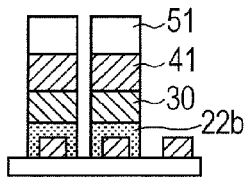
FIG. 2I
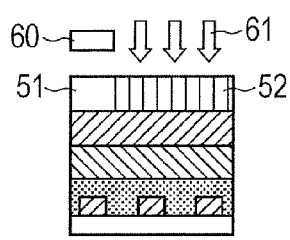
FIG. 2E
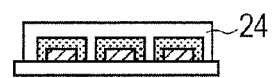
FIG. 2N
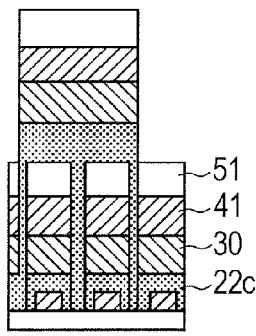
FIG. 2J
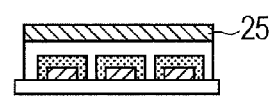
FIG. 2O
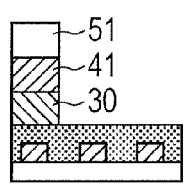
FIG. 2F
FIG. 2P

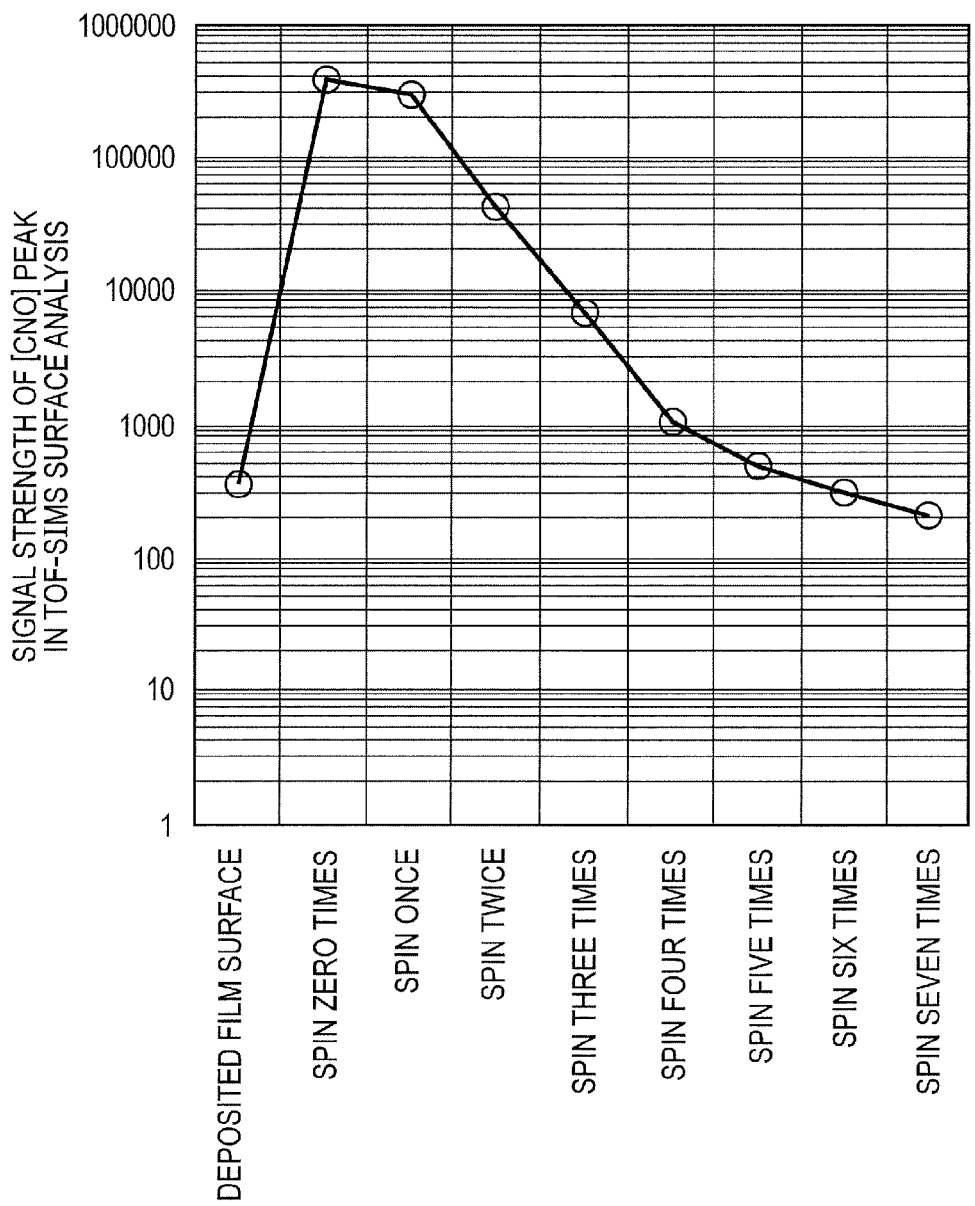

METHOD OF MANUFACTURING ORGANIC ELECTROLUMINESCENCE DISPLAY DEVICE

BACKGROUND OF THE INVENTION

1. Field of the Invention

The present invention relates to a method of manufacturing an organic electroluminescence (EL) display device.

2. Description of the Related Art

A generally known display device having organic EL elements mounted thereon is a device in which pixels each having a single or a plurality of organic EL elements are arranged in a predetermined pattern. By those pixels, a display region of the display device is two-dimensionally divided with high definition. The organic EL elements in the pixels are electronic elements which output, for example, any one of red light, green light, and blue light. A display device having organic EL elements mounted thereon obtains a full-color image by driving the organic EL elements for outputting desired colors at desired emission intensities.

Under such circumstances, a method of producing a display device having a fine organic EL element with high definition by a photolithography process is proposed. Japanese Patent No. 3839276 proposes a method involving forming a photoresist into a film directly on an emission layer. When the method is adopted, the photoresist to be used generally contains large amounts of a photoinitiator, a crosslinking agent, and the like. Here, the photoinitiator, the crosslinking agent, and the like are each a material for changing insolubility at least in a developer. Japanese Patent No. 4507759 proposes a method involving providing an intermediate layer formed of a water-soluble material on an organic compound layer, and patterning the organic compound layer by performing photolithography on the intermediate layer. Here, a water-soluble polymer for constituting the intermediate layer to be formed on an emission layer is generally insulative. In addition, Japanese Patent No. 4544811 proposes such a technology that a water-soluble polymer is used as a peeling layer and a photoresist is stripped together with the peeling layer. In addition, Japanese Patent No. 4736923 proposes a method involving dropping, to a surface of an EL layer (organic compound layer), a solvent (such as chlorobenzene or ethyl acetate) capable of dissolving a photoresist residue remaining on the organic compound layer and rotating the resultant with a spin coater to wash a surface layer portion of the EL layer.

A resist, intermediate layer, peeling layer, or the like to be used in the related art is generally insulative. Accordingly, when part of such layer remains as a residue on the surface of, for example, an emission layer constituting an organic EL element, the residue serves as a resistance to remarkably degrade the element characteristics of the organic EL element in an organic EL display device. Accordingly, upon performance of the patterning of an organic compound layer involving employing a photolithography method, the residue of the resist, intermediate layer, peeling layer, or the like needs to be removed so as not to remain on the surface of the emission layer or the like. However, when a polymer material is used as a constituent material for the resist, intermediate layer, peeling layer, or the like, it is generally difficult to sufficiently remove the material and the residue of the polymer material that cannot be completely removed remains in the device to some extent. This results from the adsorption of the polymer material to a film surface caused as described below. The polymer material is formed as a result of the bonding of an extremely large number of monomers, and hence once the material adheres to the film surface, the film surface and a polymer chain undergo an intermolecular interaction to cause the adsorption. Even when part of the polymer chain separates from the film surface, the probability that the polymer chain adheres to the film surface again is high owing to the adsorption as long as the entirety of the polymer chain does not separate from the film surface, and probably because of the foregoing, the residue of the polymer material cannot be easily removed. Therefore, the following problem has existed heretofore. The element characteristics of organic EL elements in an organic EL display device produced by patterning involving utilizing a photolithography process are inferior to the element characteristics of organic EL elements formed into a pattern with a metal mask or the like in a vacuum in-situ fashion.

SUMMARY OF THE INVENTION

The present invention has been accomplished to solve the above-mentioned problem. The present invention is directed to providing a method of manufacturing an organic EL display device including an organic EL element, which has element characteristics comparable to those of an organic EL element formed by use of a metal mask or the like in a vacuum in-situ fashion, while utilizing a patterning approach based on photolithography.

The method of manufacturing an organic EL display device according to the present invention is a method of manufacturing an organic EL display device having a plurality of organic EL elements each including a first electrode, a second electrode, and an organic compound layer disposed between the first electrode and the second electrode, in which the organic compound layer is patterned in a predetermined shape, the method including: an organic compound layer-forming step of forming an organic compound layer on a first electrode; a sacrificial layer-forming step of forming a sacrificial layer soluble in a polar solvent on the organic compound layer; an intermediate layer-forming step of forming an intermediate layer formed of a water-soluble polymer on the sacrificial layer; a processing step of patterning the sacrificial layer, the intermediate layer, and the organic compound layer; a step of bringing the intermediate layer into contact with a liquid that contains water to remove the intermediate layer and a layer provided above the intermediate layer; and a sacrificial layer-removing step of removing the sacrificial layer in the stated order, in which the sacrificial layer-removing step includes a step of performing a contacting step of bringing the sacrificial layer and the polar solvent into contact with each other a plurality of times.

Further features of the present invention will become apparent from the following description of exemplary embodiments with reference to the attached drawings.

BRIEF DESCRIPTION OF THE DRAWINGS

FIG. 1 is a schematic sectional view illustrating an example of an organic EL display device to be manufactured by a manufacturing method of the present invention.

FIGS. 2A, 2B, 2C, 2D, 2E, 2F, 2G, 2H, 2I, 2J, 2K, 2L, 2M, 2N, 2O and 2P are each a schematic sectional view illustrating a first embodiment in the method of manufacturing an organic EL display device according to the present invention.

FIG. 7 is a graph showing a change in signal strength of CNO in TOF-SIMS surface analysis on the surface of the sacrificial layer after the performance of the spin washing method.

DESCRIPTION OF THE EMBODIMENTS

Figure 3:
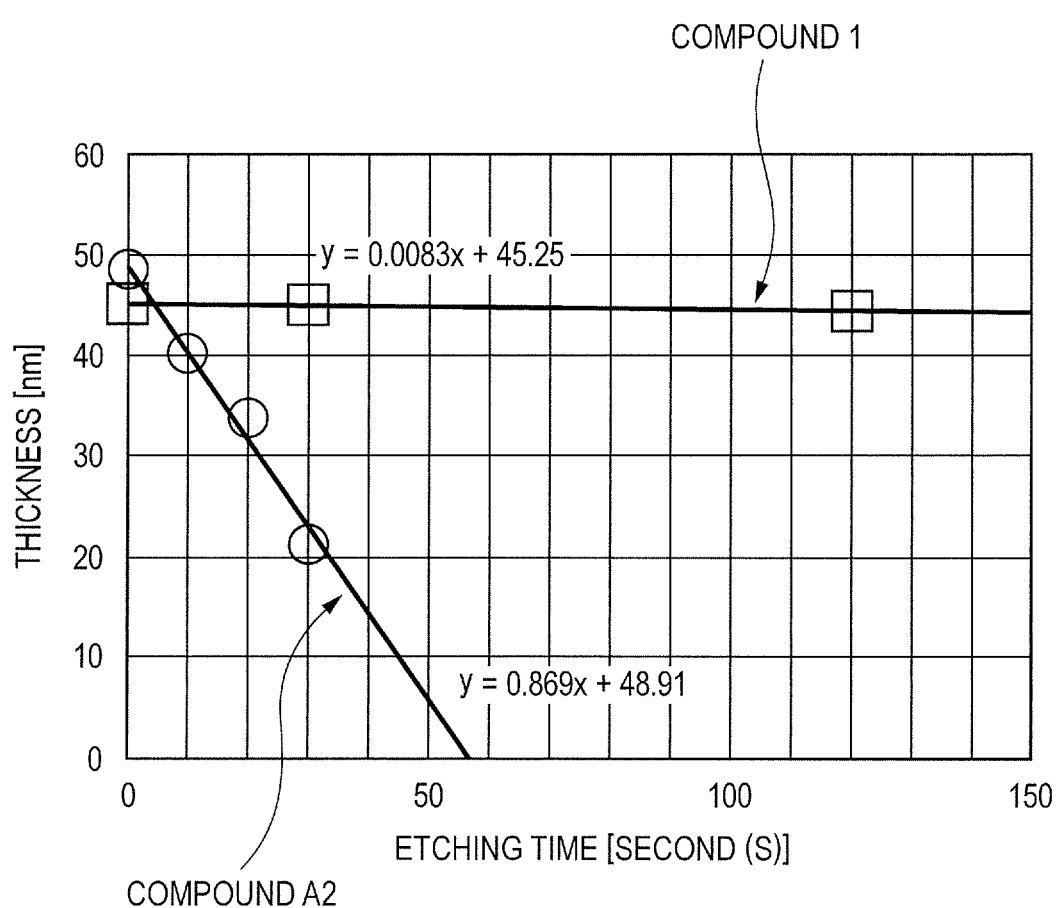
FIG. 3 is a graph showing a change in thickness with an etching time in each of a compound 1 and a compound A2.

The manufacturing method of the present invention is a method of manufacturing an organic EL display device having a plurality of organic EL elements each including a first electrode, a second electrode, and an organic compound layer disposed between the first electrode and the second electrode, in which the organic compound layer is patterned in a predetermined shape.

In addition, the manufacturing method of the present invention includes at least the following steps (A) to (E):

(A) an organic compound layer-forming step of forming an organic compound layer on a first electrode;

(B) a sacrificial layer-forming step of forming a sacrificial layer on the organic compound layer;

(C) an intermediate layer-forming step of forming an intermediate layer formed of a water-soluble polymer on the sacrificial layer;

(D) a processing step of patterning the sacrificial layer and the organic compound layer; and (E) a sacrificial layer-removing step of removing the sacrificial layer.

In the present invention, the sacrificial layer-removing step (step (E)) is the step of performing a contacting step of bringing the sacrificial layer and a polar solvent into contact with each other a plurality of times.

In the present invention, the sacrificial layer is preferably a deposited film formed of a charge-transportable organic compound and is preferably a thin-film layer soluble in the polar solvent. In general, a material in an organic compound layer constituting an organic EL element has a small solubility in a polar solvent. Therefore, the polar solvent to be used in the step (E) can selectively dissolve the sacrificial layer while being substantially free of dissolving the organic compound layer. Further, even when the sacrificial layer remains on the surface of the organic compound layer after the performance of the step (E), the formation of a layer or member constituting the organic EL element such as the second electrode on the sacrificial layer does not inhibit the flow of charge because the constituent material for the layer is the charge-transportable organic compound. It is to be noted that in the present invention, the method preferably further includes the step of forming a layer containing an alkali metal after the step (E) (sacrificial layer-removing step).

Hereinafter, embodiments of the present invention are described with reference to the drawings. It is to be noted that in the following description, a well-known technology or known technology in the art is applicable to a portion not specifically illustrated in the drawings or described. In addition, embodiments to be described below are each merely one embodiment of the present invention, and the present invention is not limited thereto. In addition, the embodiments to be described below may be appropriately combined as long as the combination does not deviate from the gist of the present invention.

Organic EL Display Device

FIG. 1 is a schematic sectional view illustrating an example of an organic EL display device to be manufactured by the manufacturing method of the present invention. An organic EL display device 1 of FIG. 1 has three kinds of sub-pixels, that is, a first sub-pixel 20a, a second sub-pixel 20b, and a third sub-pixel 20c provided on a substrate 10. Here, one set of pixels is constituted of the first sub-pixel 20a, the second sub-pixel 20b, and the third sub-pixel 20c. Although one set of pixels formed of the first sub-pixel 20a, the second sub-pixel 20b, and the third sub-pixel 20c is illustrated in the organic EL display device 1 of FIG. 1, a plurality of pixels are arranged in a matrix fashion on the substrate 10 in an actual organic EL display device.

In addition, in the organic EL display device 1 of FIG. 1, each sub-pixel (20a, 20b, 20c) has a first electrode 21, an organic compound layer 22, a charge transport layer 23, a charge injection/transport layer 24, and a second electrode 25.

The first electrode 21 (21a, 21b, 21c) is an electrode layer (lower electrode) provided on the substrate 10, and is separately provided for each sub-pixel. In addition, the first electrodes 21a, 21b, 21c are each electrically connected to a switching element (not shown) such as a transistor.

The organic compound layer 22 (22a, 22b, 22c) is a single layer formed of a predetermined organic compound or a stack formed of a plurality of layers of such kind. It is to be noted that the organic compound layer 22a, 22b, 22c has at least an emission layer (not shown) for outputting light of any one of the colors including a red color, a green color, and a blue color.

The charge injection/transport layer 24 is provided for injecting or transporting a hole or electron injected from the second electrode 25 into the organic compound layer 22. Although the charge injection/transport layer 24 is provided as a layer common to the respective sub-pixels (20a, 20b, 20c) in the organic EL display device 1 of FIG. 1, the present invention is not limited thereto. In other words, the charge injection/transport layer 24 may be separately provided for each sub-pixel.

Although the second electrode 25 (upper electrode) is provided as a layer common to the respective sub-pixels (20a, 20b, 20c) as in the charge injection/transport layer 24 in the organic EL display device 1 of FIG. 1, the present invention is not limited thereto. In other words, the second electrode 25 may be separately provided for each sub-pixel.

Method of Manufacturing Organic EL Display Device

Next, a method of manufacturing an organic EL display device according to the present invention is described by using a method of manufacturing the organic EL display device of FIG. 1 including three kinds of sub-pixels for displaying colors different from one another as a specific example thereof.

As described above, the method of manufacturing an organic EL display device according to the present invention includes at least the following steps (A) to (E):

(A) an organic compound layer-forming step of forming an organic compound layer on a first electrode;

(B) a sacrificial layer-forming step of forming a sacrificial layer on the organic compound layer;

(C) a sacrificial layer-processing step of processing the sacrificial layer into a predetermined shape;

(D) an organic compound layer-processing step of removing the organic compound layer in a region not covered with the sacrificial layer processed in the sacrificial layer-processing step; and (E) a sacrificial layer-removing step.

FIGS. 2A to 2P are each a schematic sectional view illustrating an example of a manufacturing process for the organic EL display device of FIG. 1. FIGS. 2A to 2P are each also a schematic sectional view illustrating a first embodiment in the method of manufacturing an organic EL display device according to the present invention. Upon manufacture of the organic EL display device of FIG. 1, the organic EL display device is manufactured by, for example, the following steps:

(1) a first electrode-forming step (FIG. 2A);
(2) an organic compound layer-forming step (FIG. 2B);
(3) a sacrificial layer-forming step (FIG. 2B);
(4) an intermediate layer-forming step (FIG. 2C);
(5) a photosensitive resin layer-forming step (FIG. 2D);
(6) a photosensitive resin layer-processing step (FIG. 2E);
(7) a sacrificial layer-processing step (FIG. 2F);
(8) an organic compound layer-processing step (FIG. 2G);
(9) a photosensitive resin layer-removing step (FIG. 2M);
(10) a sacrificial layer-removing step (FIG. 2N);
(11) a charge injection/transport layer-forming step (FIG. 2O); and
(12) a second electrode-forming step (FIG. 2P).

It is to be noted that the steps (1) to (12) are merely examples, and the present invention is not limited to the embodiment modes. As the organic EL display device 1 of FIG. 1 requires the production of each of the three kinds of sub-pixels (20a, 20b, 20c) having different luminescent colors, the steps (2) to (8) need to be performed a total of three times after the performance of the step (1) before the performance of the step (9). For example, first, the organic compound layer 22a in the first sub-pixel 20a is formed by the steps (2) to (8) (FIG. 2G). Then, the organic compound layer 22b in the second sub-pixel 20b is formed by the steps (2) to (8) (FIGS. 2H and 2I). After that, the organic compound layer 22c in the third sub-pixel 20c is formed by the steps (2) to (8) (FIGS. 2J and 2K).

Next, each of the steps (1) to (11) is specifically described.

(1) First Electrode-Forming Step (FIG. 2A)

First, the first electrodes (21a, 21b, 21c) are formed on the substrate 10 (FIG. 2A). A known substrate such as a glass substrate can be selected as the substrate 10. The first electrodes (21a, 21b, 21c) are electrode layers each formed of a known electrode material, and the constituent material is appropriately selected in correspondence with a light extraction direction. When a top emission type organic EL display device is produced, the first electrodes (21a, 21b, 21c) are reflective electrodes, and the second electrode 25 to be described later is an optically transparent electrode. On the other hand, when a bottom emission type organic EL display device is produced, the first electrodes (21a, 21b, 21c) are optically transparent electrodes, and the second electrode 25 is a reflective electrode.

When the first electrodes (21a, 21b, 21c) are formed as reflective electrodes, the constituent material for each of the first electrodes (21a, 21b, 21c) is preferably a metal material such as Cr, Al, Ag, Au, or Pt. Of those metal materials, a material having a high reflectance is more preferred because the material can additionally improve light extraction efficiency. A reflective electrode is separately formed for each sub-pixel by, for example, forming a thin film of the metal material by a known method such as sputtering and processing the thin film into a desired shape by means of photolithography or the like. It is to be noted that a layer formed of an oxide semiconductor having light-transmitting property such as indium tin oxide or indium zinc oxide may be further provided on the thin film formed of the metal material by reason of, for example, the protection of the thin film or the regulation of a work function. Vapor deposition with a metal mask may also be utilized upon formation of the first electrodes (21a, 21b, 21c). Even when the vapor deposition with a metal mask is performed, the first electrode 21a, 21b, 21c is separately formed for each sub-pixel.

When the first electrodes (21a, 21b, 21c) are formed as optically transparent electrodes, examples of the constituent material for each of the first electrodes (21a, 21b, 21c) include oxide semiconductors each having light-transmitting property such as indium tin oxide (ITO) and indium zinc oxide.

(2) Organic Compound Layer-Forming Step (FIG. 2B and the Like)

The organic compound layer 22 (22a, 22b, 22c) is a constituent member for the organic EL display device, and is a single layer, or a stack formed of a plurality of layers, including at least an emission layer. A layer except the emission layer in the organic compound layer 22 is, for example, a hole injection layer, a hole transport layer, an electron blocking layer, a hole blocking layer, an electron transport layer, or an electron injection layer. However, the present invention is not limited thereto. Here, a layer to be brought into contact with the emission layer may be a charge transport layer (a hole transport layer or an electron transport layer), or may be a charge blocking layer (an electron blocking layer or a hole blocking layer).

For example, an arylamine derivative, a stilbene derivative, a polyarylene, a fused polycyclic hydrocarbon compound, a heterocyclic aromatic compound, a heterocyclic fused polycyclic compound, and an organometallic complex compound, and homooligomers and heterooligomers thereof can each be used as an organic light-emitting material of each color (red color/green color/blue color) in the emission layer. However, the light-emitting material in the present invention is not limited to the materials.

It is to be noted that the luminescent colors of the emission layers in the three kinds of organic compound layers 22a, 22b, 22c provided for the first electrodes 21a, 21b, 21c, respectively upon manufacture of the organic EL display device of FIG. 1 are a blue color, a red color, and a green color, respectively, i.e., the luminescent colors are different from one another. In addition, a combination of the luminescent colors is not particularly limited.

In the present invention, the sacrificial layer needs to be selectively etched in the sacrificial layer-removing step to be performed after the patterning of the organic compound layer. Thus, the entirety of the organic compound layer 22 to be formed in the organic compound layer-forming step is preferably a layer formed of a material having a lower solubility in the polar solvent than the sacrificial layer does. Here, the organic compound layer 22 has at least an emission layer, and may include a layer selected from a hole blocking layer, an electron blocking layer, a charge transport layer (a hole transport layer or an electron transport layer), and a charge injection layer (an electron injection layer or a hole injection layer). Here, the material having a low solubility in a polar solvent is specifically a fused polycyclic hydrocarbon compound free of an m-terphenyl group.

Here, the fused polycyclic hydrocarbon compound is a cyclic, unsaturated organic compound constituted only of a hydrocarbon. More specifically, the compound is a compound containing a fused ring obtained by the condensation of at least one side of an aromatic ring such as a benzene ring. Specific examples of the fused polycyclic hydrocarbon compound include naphthalene, fluorene, fluoranthene, chrysene, anthracene, tetracene, phenanthrene, pyrene, and triphenylene.

However, it is hard to utilize the fused polycyclic hydrocarbon compound as a constituent material for the organic compound layer because the compound has low heat stability when used as it is. Therefore, a compound obtained by adding a substituent to such fused polycyclic hydrocarbon compound is used as a constituent material for the organic compound layer.

Here, a compound as a constituent material for, in particular, the uppermost layer of the organic compound layer is preferably an organic compound obtained by the bonding of the plurality of fused polycyclic hydrocarbon compounds with a single bond. The organic compound includes a compound obtained by appropriately substituting the fused polycyclic hydrocarbon compound as a main skeleton with an alkyl group such as a methyl group or an ethyl group or a phenyl group. It is to be noted that such organic compound does not include any compound having a heteroatom (such as N or O) in its main skeleton or a substituent thereof, and hence has a particularly low solubility in a polar solvent.

A layer formed of the fused polycyclic hydrocarbon compound has charge-transporting property. Here, the charge-transporting property refers to a characteristic that allows a current to flow. Specific examples of the layer having charge-transporting property include an electron injection layer, a hole injection layer, and a blocking layer as well as an electron transport layer and a hole transport layer.

It is to be noted that an existing method such as a vacuum deposition method, a spin coating method, a dip coating method, or an ink jet method can be employed as a method of forming the layer formed of the fused polycyclic hydrocarbon compound. The film forming-method is more preferably the vacuum deposition method in consideration of the emission characteristic of the organic EL display device.

(3) Sacrificial Layer-Forming Step (FIG. 2B)

A sacrificial layer 30 is a layer for protecting the organic compound layer from the organic compound layer-patterning step. The sacrificial layer 30 to be provided on the organic compound layer 22 may be a single layer, or may be a stack formed of a plurality of layers. In the present invention, when the sacrificial layer 30 is formed of a single layer, the layer is a deposited film formed of a material soluble in a polar solvent. Alternatively, when the sacrificial layer 30 is a stack formed of a plurality of layers, at least the lowermost layer out of the layers constituting the stack is a layer formed of a low-molecular weight material formed into a film by the vacuum deposition method. More specifically, the lowermost layer of the sacrificial layer 30 is a deposited film formed of the material soluble in the polar solvent. As a result, the sacrificial layer 30 can be selectively removed with the polar solvent. In addition, the sacrificial layer 30 in the present invention is preferably an amorphous film.

Here, the reason why the sacrificial layer 30 (or at least the lowermost layer thereof) is a deposited film formed from the material soluble in the polar solvent by the vacuum deposition method is described.

The material to be formed into a film by the vacuum deposition method is naturally limited to a low-molecular weight compound having sublimability because the vacuum deposition method is a thin-film formation method to be applied to a compound having high sublimability. The compound having high sublimability is specifically a compound that sublimates under a pressure of $10^{-4}$ Pa to $10^{-5}$ Pa and at a temperature of 400° C. or less. In addition, the molecular weight of the compound in the deposited film is smaller than that of a polymer material, and hence an interaction (intermolecular force) between molecules constituting the deposited film is weak and their adsorption forces to the organic compound layer 22 are also weak. Further, the state of each of the molecules in the deposited film formed in an amorphous state, e.g., relative orientation between the molecules is random. Accordingly, an intermolecular distance is larger than that in a solid state or a crystalline state, and hence a state where the molecules spread out and a solvent molecule is easy to enter, i.e., a state where the molecules are easy to dissolve is established. Accordingly, such deposited film (of the organic compound) formed by the vacuum deposition method can be etched and removed in a substantially uniform manner from the surface by being brought into contact with a solvent containing the polar solvent.

A polar solvent is preferably used in the sacrificial layer-removing step to be described later. In addition, the polar solvent to be used for removing the sacrificial layer is more preferably a mixed solvent obtained by mixing an organic solvent miscible with water and water. A plurality of kinds of organic solvents miscible with water may be used.

Here, the polar solvent is an organic polar solvent, and examples thereof include alcohols, polyhydric alcohols, ketones, esters, pyridines, and ethers. It is to be noted that after the performance of the sacrificial layer-removing step to be described later, the solvent used in the removing step needs to be removed by being volatilized. Therefore, the organic solvent to be used preferably has a boiling point at least lower than the decomposition temperature or glass transition temperature of the organic compound in the organic compound layer 22. When the alcohols are taken as specific examples, alcohols having less carbon atoms, such as methanol, ethanol, and isopropyl alcohol, or the like, are each preferred because of a low boiling point.

A factor for the occurrence of a difference in etching rate of a film formed of various compounds with respect to the polar solvent, i.e., a difference in solubility can be considered as described below. The compounds exemplified as the polar solvent each necessarily contain a heteroatom in a molecule thereof and the heteroatom functions as a polar site of a compound molecule of interest. Then, the polar site interacts with a polar site in the constituent material for the sacrificial layer, whereby the constituent material for the sacrificial layer is dissolved in the polar solvent. In addition, the interaction between the polar sites affects the solubilities of the various compounds in the polar solvent. In consideration of the foregoing, the solubility of the lowermost layer of the sacrificial layer 30 can be improved as compared with the solubility of the organic compound layer in the solvent formed of the polar solvent by appropriately selecting the polar solvent while taking the structure of the compound to be used as the constituent material for the sacrificial layer into consideration.

In a heterocyclic compound, charge is localized on a heteroelement except carbon (such as N, O, or S). In the case of, for example, pyridine having a nitrogen atom in its ring, the polarity of an entire molecule is caused by the localization of negative charge on the nitrogen atom. Here, when an organic solvent containing a hydrogen atom of a hydroxyl group (—OH) or the like on which positive charge is localized (miscible with water) is assumed to interpose, a hydrogen bond is formed between the site (N atom) which the heterocyclic compound has and on which negative charge is localized, and the hydrogen atom in a polar solvent molecule on which positive charge is localized. When the hydrogen bond is formed as described above, the heterocyclic compound dissolves, or becomes easily soluble, in the polar solvent.

The bias of n-electrons occurs in a compound obtained by introducing an electron-withdrawing group or an electron-donating group into an aromatic ring, thereby causing polarization. Here, when an electron-withdrawing substituent is introduced, negative charge is localized on the substituent to cause polarity. When an electron-donating substituent is introduced, positive charge is localized on the substituent to cause polarity. The occurrence of the polarity enables an interaction with a solvent molecule of the polar solvent, thereby improving the solubility in the organic solvent.

In view of the foregoing discussion, a compound belonging to any one of such compound groups as described below is preferably used as a material, which has charge-transporting property and good solubility, suitable for the sacrificial layer to be used in the present invention. However, the material is not limited to the following examples as long as the material follows the discussion.

Here, a difference between the solubilities of the constituent material for the organic compound layer and the constituent material for the sacrificial layer in the polar solvent is described. Description is given by taking, as specific examples, the etching rates of: the following compound 1 as a compound having a fused polycyclic hydrocarbon free of an m-terphenyl structure to be used as the constituent material for the organic compound layer; and the following compound A2 to be used as the constituent material for the sacrificial layer.

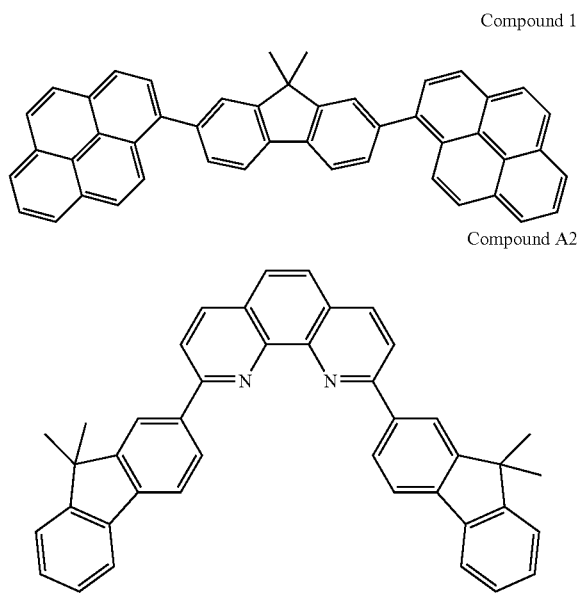

Compound 1

Compound A2

In the present invention, a larger etching rate means a higher dissolution rate. In addition, a larger etching rate means a higher solubility of a layer having a material of interest in the solvent (polar solvent).

FIG. 3 is a graph showing thickness changes in the compound 1 and the compound A2 over an etching time. Here, FIG. 3 shows the results of the etching of the respective layers when a mixed solvent obtained by mixing isopropyl alcohol (IPA) and water so that IPA may account for 60 wt % (hereinafter, sometimes referred to as "IPA/water mixed solvent") is used as a solvent formed of a polar solvent.

For example, a layer (layer A) formed of the compound 1 as a fused polycyclic hydrocarbon compound shows nearly no thickness reduction even when the etching time is lengthened. On the other hand, the thickness of a layer (layer B) formed of the compound A2 as a heterocyclic compound reduces over time. When the etching rates of the respective layers are calculated with their etching conditions made identical to each other, the etching rate of the layer A is 0.008 nm/sec but the etching rate of the layer B is 0.87 nm/sec, that is, a ratio of the latter to the former is about 100.

An etching rate ratio between both layers can be increased by selecting each of a constituent material for the uppermost layer of the organic compound layer and a constituent material for (the lowermost layer of) the sacrificial layer while taking its solubility in the polar solvent into consideration as described above. As a result, the sacrificial layer can be selectively removed with the polar solvent. Therefore, the organic compound layer 22 is protected from damage due to, for example, elution into the polar solvent or the permeation of the solvent.

Figure 4:
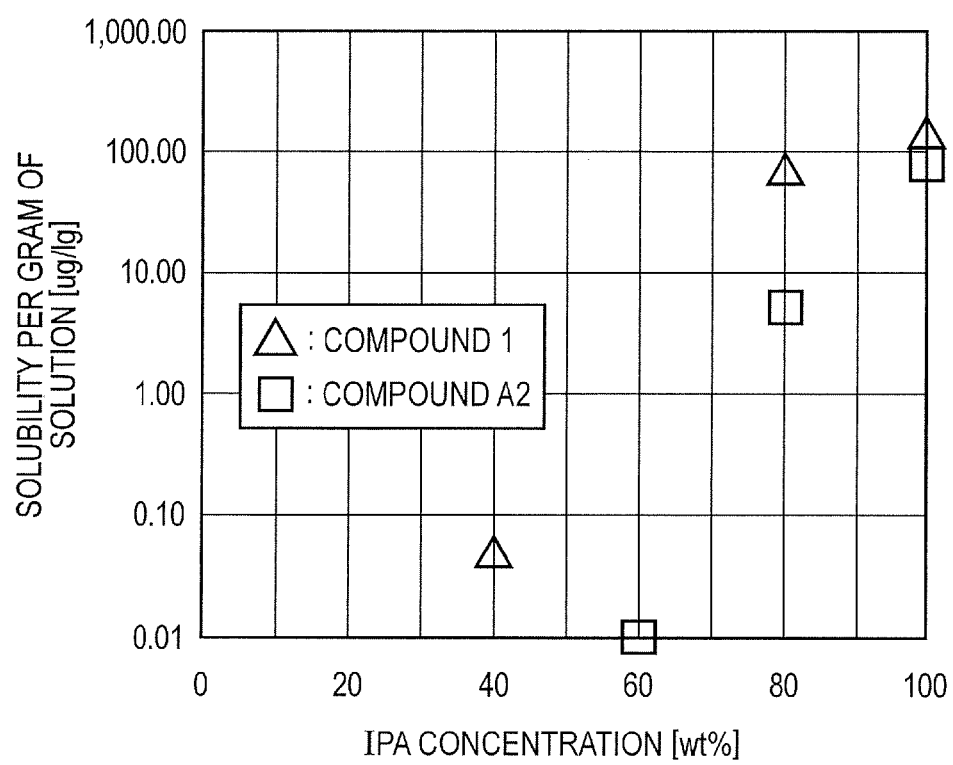
FIG. 4 is a graph showing the solubilities of a predetermined fused polycyclic hydrocarbon compound and a predetermined heterocyclic compound in an aqueous solution of isopropyl alcohol.

The solubility of a compound as a constituent material for each layer in the IPA/water mixed solvent varies depending on the weight ratio of IPA in the mixed solvent. FIG. 4 is a graph showing the solubilities of the compound 1 (fused polycyclic hydrocarbon compound) and the compound A2 (heterocyclic compound) in the IPA/water mixed solvent (polar solvent). Here, in the graph of FIG. 4, the axis of abscissa indicates the weight percent concentration of IPA in the IPA/water mixed solvent, and the axis of ordinate indicates the amount of the fused polycyclic hydrocarbon compound or heterocyclic compound to dissolve in 1 g of the solvent. As can be seen from FIG. 4, while the amount in which the compound 1 (fused polycyclic hydrocarbon compound) dissolves in 1 g of the IPA/water mixed solvent having an IPA concentration of 80 wt % is 5 μg, the dissolution amount of the compound A2 (heterocyclic compound) is 73 μg.

The graph of FIG. 4 is also a graph that proves the following items (a) and (b):

(a) when the concentration of IPA in the IPA/water mixed solvent is excessively high, both the constituent material for the sacrificial layer and the constituent material for the organic compound layer dissolve in the IPA/water mixed solvent at so high rates that a situation in which the etching rate ratio is close to 1 is established; and (b) in the case of the item (a), adding water to reduce the concentration of IPA can enlarge the etching rate ratio while reducing the dissolution rates of the respective materials.

As described above, the constituent material for the sacrificial layer 30 is selected in consideration of factors that dominate the solubility in the polar solvent such as an interaction between polar sites, a hydrogen bond, and a molecular size. Such selection can increase the solubility of the sacrificial layer 30 in the polar solvent as compared with the solubility of any layer constituting the adjacent organic compound layer therein. However, a polar solvent except water involves the following possibility. The difference in solubility does not become so large depending on the kind and concentration of the solvent, and hence the etching rate ratio approaches 1.

In such case, the solvent is preferably used as a polar solvent mixed with water. Specifically, the water content is preferably regulated in an appropriate fashion so that the etching rate of the sacrificial layer may be even larger than that of the organic compound layer. The water content is more preferably regulated in an appropriate fashion so that the etching rate ratio of the sacrificial layer to the layer positioned at the uppermost layer in the organic compound layer may exceed 10. As a result, the sacrificial layer can be more selectively removed, and hence reductions in the characteristics of the organic EL display device can be prevented.

(4) Intermediate Layer-Forming Step (FIG. 2C and the Like)

An intermediate layer 40 formed of a water-soluble polymer is formed as a layer for protecting the organic compound layer on the upper layer of the sacrificial layer 30.

Examples of the water-soluble material as a constituent material for the intermediate layer 40 include known water-soluble polymer materials such as a polyvinyl alcohol, a polyethylene glycol, and a polyvinyl pyrrolidone. In addition, an existing method such as a known spin coating method, dip coating method, or ink jet method can be employed upon formation of the intermediate layer 40. Here, the organic compound layer 22 is not etched by a solvent upon formation of the intermediate layer 40 because the organic compound layer 22 is a layer formed of a material that does not dissolve in water. In addition, when the intermediate layer 40 is formed so as to have a large thickness, an influence such as the dissolution of the organic compound layer 22 by the solvent of the photosensitive resin layer 50, a reduction in the thickness of the organic compound layer 22, or the elution of a light-emitting material can be additionally alleviated.

A barrier layer may be formed on the intermediate layer 40. The formation of the barrier layer on the intermediate layer 40 can suppress a phenomenon in which a solvent to be used upon formation of a photosensitive resin layer 50 in the next step permeates the sacrificial layer to be in contact with the organic compound layer 22. Accordingly, restrictions upon selection of the solvent for the photosensitive resin layer 50, e.g., a requirement that the solvent should not dissolve the organic compound layer are removed, and hence an additionally cheap material can be selected.

The barrier layer is preferably a film insoluble in water and an organic solvent, the film having moisture resistance and gas barrier property. In addition, the layer more preferably has such a characteristic as to absorb light to be applied at the time of photolithography. A thin-film layer of an inorganic compound using silicon nitride (SiN) as a main material is suitable as the barrier layer.

(5) Sacrificial Layer-Processing Step (FIGS. 2D to 2F and the Like)

In the present invention, a photolithography method can be utilized as means for patterning (processing) the sacrificial layer 30 into a desired shape. Here, a processing process for the sacrificial layer (sacrificial layer-processing step) involving utilizing the photolithography method is described.

(i) Steps of Forming and Processing Photosensitive Resin Layer (FIGS. 2D and 2E and the Like)

When the photolithography method is utilized, the photosensitive resin layer 50 needs to be provided on the sacrificial layer 30 first. A known material can be used as a photosensitive resin as a constituent material for the photosensitive resin layer 50. In addition, an existing method such as a spin coating method, a dip coating method, or an ink jet method can be employed as a method of forming the photosensitive resin layer 50. A vacuum deposition method can be utilized in some situations.

After the formation of the photosensitive resin layer 50, the photosensitive resin layer 50 is processed. Here, the step of processing the photosensitive resin layer 50 is divided into the exposure of the photosensitive resin layer (exposing step) and the development of the photosensitive resin layer (developing step).

Here, an existing light irradiation device can be used in the exposing step. It is to be noted that an exposure device in accordance with the fineness of a mask pattern has only to be used. In addition, upon performance of the exposing step, a photomask 60 having an opening is used in a region to be exposed. It is to be noted that a generally used photomask having a light-shielding region formed of a Cr thin film can be used as the photomask. Meanwhile, ultraviolet light or visible light can be utilized as light with which the photosensitive resin layer 50 is irradiated in the exposing step.

By the way, upon performance of the exposing step, the exposure region of the photosensitive resin layer 50 is desirably determined in consideration of the nature of the photosensitive resin as the constituent material for the photosensitive resin layer 50. Specifically, when a positive photosensitive resin is used, a region from which one wishes to remove the photosensitive resin layer 50 in the next developing step is defined as the exposure region. On the other hand, when a negative photosensitive resin is used, a region where he or she wishes to leave the photosensitive resin layer 50 when the next developing step is performed is defined as the exposure region. Here, FIG. 2E illustrates the case where a positive photosensitive resin is used. In FIG. 2E, a region 52 out of the photosensitive resin layer 50 irradiated with ultraviolet light 61 is removed in the next developing step. Meanwhile, a region 51 shielded from the ultraviolet light with the photomask 60 serves to protect the organic compound layer 22a provided for a predetermined region (the first sub-pixel 20a) in the sacrificial layer-processing step or the organic compound layer-processing step to be performed later.

Upon performance of the developing step, a developer suitable for the photosensitive resin as the constituent material for the photosensitive resin layer 50 has only to be used.

(ii) Intermediate Layer-Processing Step (FIG. 2F and the Like)

Although a method for the removal of the intermediate layer 40 is not particularly limited, an existing thin-film processing method such as wet etching or dry etching can be specifically employed, provided that the dry etching is preferred because the dry etching has a smaller influence of side etching due to a solvent than that of any other method. When the barrier layer formed of the inorganic compound is formed on the intermediate layer formed of the water-soluble polymer, the intermediate layer 40 is desirably processed after the barrier layer has been processed by a known thin-film processing method because an etchant different from that for the intermediate layer needs to be used.

(iii) Sacrificial Layer-Processing Step (FIG. 2F and the Like)

Next, the sacrificial layer 30 is processed by selectively removing a region out of the sacrificial layer not covered with the photosensitive resin layer 50. Although a method of selectively removing the sacrificial layer 30 is not particularly limited, specifically, an existing thin film-processing method such as wet etching or dry etching can be employed, provided that the dry etching is preferred because an influence of side etching by a solvent is smaller than that of any other method.

In the foregoing description, a photolithography process involving using a photoresist is utilized as means for processing the sacrificial layer 30, but a method of processing the sacrificial layer 30 is not limited thereto. For example, the sacrificial layer may be patterned in a desired shape by utilizing an ink jet mode, printing, laser processing, or the like. A pixel size can be made as high-definition as about 10 µm because a high-definition metal mask is not used in the manufacturing method of the present invention. Therefore, the manufacture of an organic EL display device having a large supporting substrate size such as a fifth- or subsequent-generation size can be realized.

(6) Organic Compound Layer-Processing Step (FIG. 2G and the Like)

Next, the organic compound layer 22 in a region not covered with the sacrificial layer 30 out of the organic compound layer 22 is selectively removed in the same manner as in the sacrificial layer-removing step. It is to be noted that the step of processing the sacrificial layer 30 and the step of processing the organic compound layer 22 may be collectively performed after the photosensitive resin layer-forming and processing step.

The organic compound layer can be formed so as to be selectively provided only in a predetermined sub-pixel by the foregoing process. In addition, in each sub-pixel, a desired organic compound layer can be selectively formed only in the sub-pixel by repeatedly performing a process from the organic compound layer-forming step to the organic compound layer-processing step described above the number of times corresponding to the number of kinds of sub-pixels.

(7) Intermediate Layer-Removing Step (FIG. 2M)

Next, the intermediate layer 40 (41) is selectively removed (FIG. 2M). The intermediate layer 40 can be removed by being brought into contact with a liquid containing water to be dissolved because the layer is a water-soluble polymer. Simultaneously, a layer remaining on the intermediate layer 40 can be removed together. As described in the foregoing, it is difficult to completely remove the residue of the intermediate layer 40 as a polymer material from the surface of the sacrificial layer because the intermediate layer 40 that has dissolved once adheres to the surface of the sacrificial layer 30 again.

(8) Sacrificial Layer-Removing Step (FIG. 2N)

Next, the sacrificial layer 30 is removed (FIG. 2N). The step of removing the sacrificial layer 30 is specifically the step of bringing the substrate 10 on which the sacrificial layer 30 remains and a polar solvent into contact with each other after the organic compound layer-processing step. In the present invention, examples of the polar solvent include the organic polar solvents described above, provided that the polar solvent is not limited to a pure solvent and a mixed solvent obtained by mixing the pure solvent with water is also included in the category of the polar solvent. Here, when the substrate 10 on which the sacrificial layer 30 remains is brought into contact with the polar solvent, the sacrificial layer 30 is sequentially dissolved from the opposite side of the substrate 10.

It is particularly preferred to remove the sacrificial layer 30 after the processing (patterning) of the organic compound layer (22a, 22b, 22c) has been completed and after a layer above the sacrificial layer 30 has been removed. This is because the following phenomenon can be avoided during the process: impurities in, for example, a layer such as the resist layer 51 to be provided above the sacrificial layer 30, a resist-developing liquid, and a peeling liquid mix into the organic compound layer (22a, 22b, 22c) to reduce element characteristics.

When the sacrificial layer 30 and the polar solvent are in contact with each other, the sacrificial layer 30 dissolves and the residue of the intermediate layer 40 remaining on the sacrificial layer 30 is eluted together. After that, when the polar solvent in contact with the substrate 10 is separated from the substrate 10, for example, (at least part of) the sacrificial layer 30 that has dissolved in the polar solvent and the residue of the intermediate layer 40 separate from the substrate 10 together with the polar solvent. However, when the step of bringing the sacrificial layer 30 and the polar solvent into contact with each other is performed only once, the residue of the intermediate layer 40 may adhere onto the remaining sacrificial layer 30 again. Accordingly, the step of bringing the sacrificial layer 30 and the polar solvent into contact with each other needs to be performed at least twice in order that the residue of the intermediate layer 40 may be sufficiently removed. As a result, the residue of the water-soluble polymer as a constituent material for the intermediate layer 40 can be reduced in a stepwise manner while the sacrificial layer 30 is removed from the top of the substrate 10.

For example, methods described in the following items (i) and (ii) are each available as a method of bringing the sacrificial layer 30 and the polar solvent into contact with each other:

(i) a method involving dropping the polar solvent onto the substrate 10 on which the sacrificial layer 30 remains and then rotating the substrate 10 to splash the polar solvent that has dissolved the constituent material for the sacrificial layer 30 (spin washing method); and (ii) a method involving loading the substrate 10 on which the sacrificial layer 30 remains in a container storing the polar solvent and dipping the substrate 10 in the polar solvent for a certain time period to dissolve and remove (at least part of) the sacrificial layer 30 remaining on the substrate 10 (dipping method).

FIGS. 5A to 5D are each a schematic view illustrating a removal process for the sacrificial layer 30 involving utilizing the spin washing method.

Figure 5A:
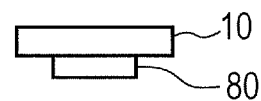
FIGS. 5A, 5B, 5C and 5D are each a schematic view illustrating a removal process for a sacrificial layer involving utilizing a spin washing method.
Figure 5B:
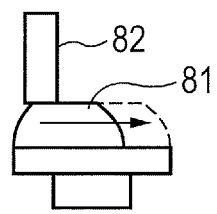
Figure 5C:
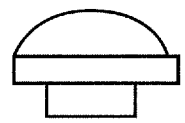
Figure 5D:
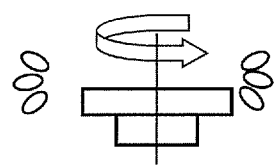

The spin washing method involves first dropping a polar solvent 81 onto the sacrificial layer 30 (FIG. 5B), holding the resultant for a predetermined time period (FIG. 5C), then rotating the substrate 10 to splash the polar solvent 81, and drying the substrate 10 by means of the rotation (FIG. 5D). The spin washing method in which the process illustrated in FIGS. 5A to 5D is defined as one cycle is typically repeated a plurality of times. It is to be noted that the polar solvents 81 to be used in the cycle to be performed a plurality of times may be the same every time, or mixed solvents having different compositional ratios may be used in part of the times or every time.

Figure 6:
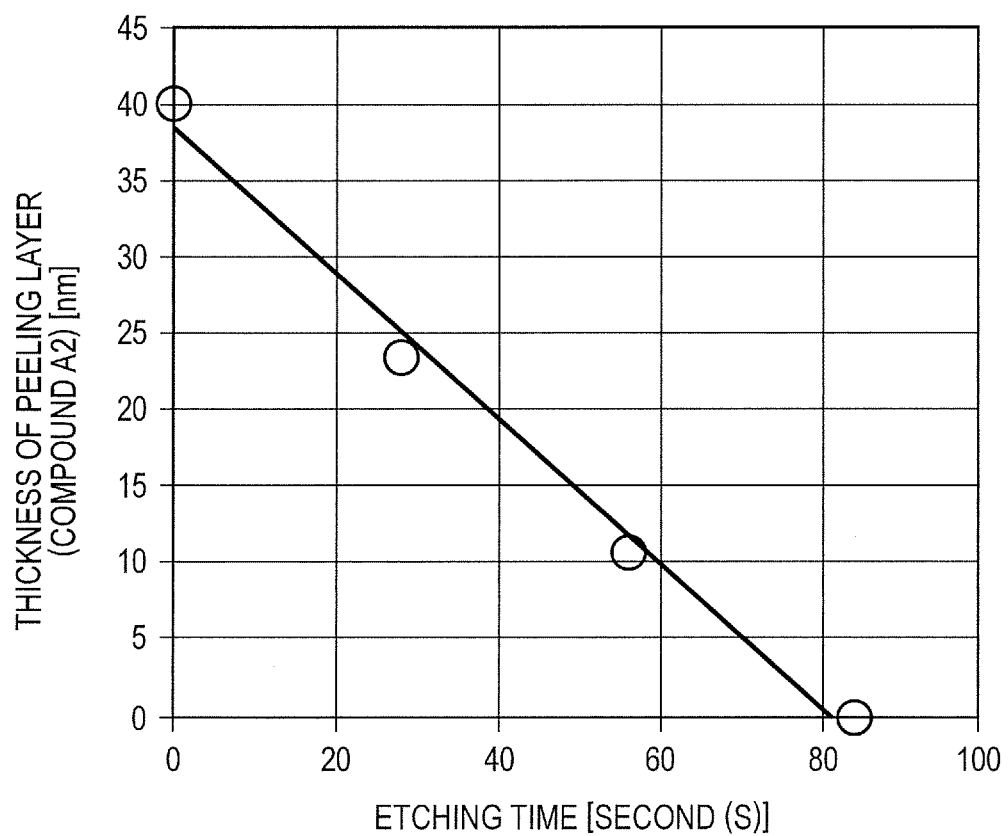
FIG. 6 is a graph showing a relationship between the total time of etching by the spin washing method and the thickness of the sacrificial layer.

FIG. 6 is a graph showing a relationship between the total time of etching by the spin washing method and the thickness of the sacrificial layer formed of the compound A2. It is to be noted that in the graph of FIG. 6, the compound A2 is used as a constituent material for the sacrificial layer 30 and a 60-wt % aqueous solution of IPA is used as a polar solvent. In addition, four plots shown in FIG. 6 represent pieces of data obtained by repeating the process based on the spin washing method zero times, twice, four times, and six times, respectively from the left. The thickness of the sacrificial layer was measured with a spectroscopic ellipsometer (HORIBA). FIG. 6 shows that repeatedly performing the process based on the spin washing method reduces the thickness of the sacrificial layer 30 by certain amounts each and that repeating the cycle six or more times can remove the sacrificial layer 30 having a thickness of 40 nm. The rate at which the sacrificial layer formed of the compound A2 is etched by one spin washing is about 6.7 nm. The spin washing is preferably performed seven or more times because the amount of the solvent to be placed on the substrate is small and hence a variation in etching rate is liable to occur. Although the graph shown in FIG. 6 is merely a specific example, the number of repetition of the process based on the spin washing method can be decided by utilizing the quantitative tendency of the sacrificial layer 30 to reduce shown in FIG. 6.

When the spin washing method is utilized, a device having an ejection portion for dropping the polar solvent to the substrate needs to be prepared. Here, the shape of the ejection portion, which is not particularly limited, is preferably, for example, a nozzle, a spray nozzle, a slit nozzle, or a shower nozzle. In addition, when the spin washing method is utilized, the substrate 10 may be stopped or may be rotated upon ejection of the polar solvent from the ejection portion.

By the way, when the spin washing method is utilized, it is not preferred that the polar solvent to be used have dissolved therein, for example, the constituent material for the sacrificial layer 30. In this case, the residue that can be present on the sacrificial layer 30 is reduced by repeating the removal process for the sacrificial layer 30 based on the spin washing method.

FIG. 7 is a graph showing a change in signal strength of CNO in TOF-SIMS surface analysis on the surface of the sacrificial layer formed of the compound A2 after the performance of the spin washing method. FIG. 7 shows results of measurement in the case where the residue of a polyvinyl pyrrolidone as a water-soluble polymer is present on the sacrificial layer 30. In the case of the polyvinyl pyrrolidone, the ionic strength of a CNO fragment derived from pyrrolidone can be specifically detected by the TOF-SIMS analysis and hence the behavior of the reduction of the residue of the polyvinyl pyrrolidone remaining on the surface of the sacrificial layer 30 can be identified by using the strength as an indicator. As shown in FIG. 7, the ionic strength of the CNO fragment as a specific peak of the polyvinyl pyrrolidone is found to be reduced in a stepwise manner by repeating the etching of the sacrificial layer 30 by the spin washing method a plurality of times. According to FIG. 7, the amount of the residue can be reduced to the same level as that on the surface of the deposited film of a comparative sample by performing the etching five to six times. The results show that the residue of the intermediate layer 40 provided on the sacrificial layer 30 cannot be sufficiently removed by performing the etching only once, though the residue is quantitatively reduced by repeating the etching.

FIGS. 8A to 8D are each a schematic view illustrating a removal process for the sacrificial layer 30 involving utilizing the dipping method.

The dipping method is a method involving loading the substrate 10 in a container storing the polar solvent, dipping the substrate 10 in the polar solvent for a certain time period, and then taking the substrate 10 out of the container. Upon dipping of the substrate 10 in the polar solvent, (at least part of) the sacrificial layer 30 is eluted. At this time, when the concentration of the water-soluble polymer material constituting the intermediate layer 40, which can be dissolved together with the sacrificial layer 30, in the polar solvent is low, the polar solvent can be reused as the polar solvent to be used in first dipping.

Figure 8A:
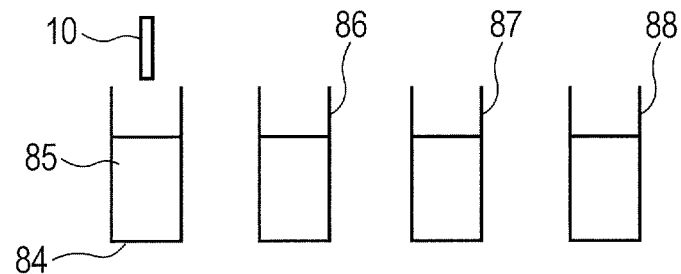
FIGS. 8A, 8B, 8C and 8D are each a schematic view illustrating a removal process for the sacrificial layer involving utilizing a dipping method.
Figure 8B:
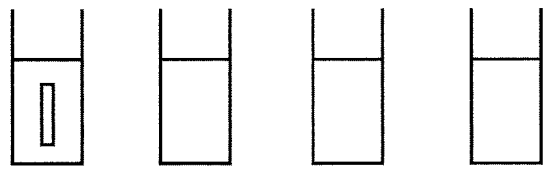
Figure 8C:
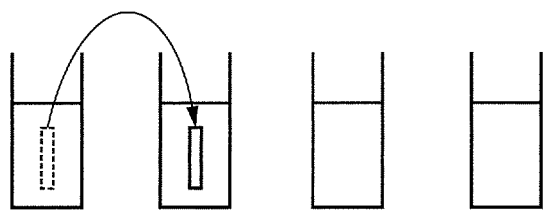
Figure 8D:
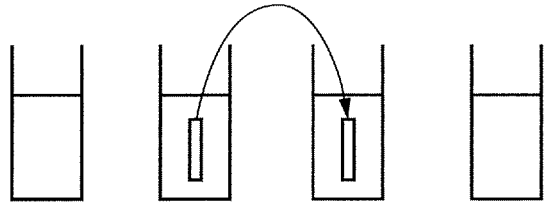

The dipping method is performed by, for example, a method to be described below. That is, the substrate 10 on which the sacrificial layer 30 remains is set on a first container 84 storing a polar solvent 85 (FIG. 8A) and then the substrate 10 is dipped in the polar solvent 85 stored in the first container 84 (FIG. 8B). Next, the substrate is taken out of the first container 84 and then the substrate 10 is loaded in the polar solvent 85 stored in a second container 86 (FIG. 8C). Next, the substrate 10 is taken out of the second container 86 and then the substrate is loaded in the polar solvent 85 stored in a third container 87 (FIG. 8D). In the dipping method illustrated in FIGS. 8A to 8D in the present invention, a process formed of the dipping and taking of the substrate needs to be performed at least twice. It is to be noted that the polar solvents 85 stored in the containers (84, 86, 87) may be mixed solvents identical to one another in compositional ratio, or mixed solvents partly or entirely different from one another in compositional ratio may be used.

Figure 9:
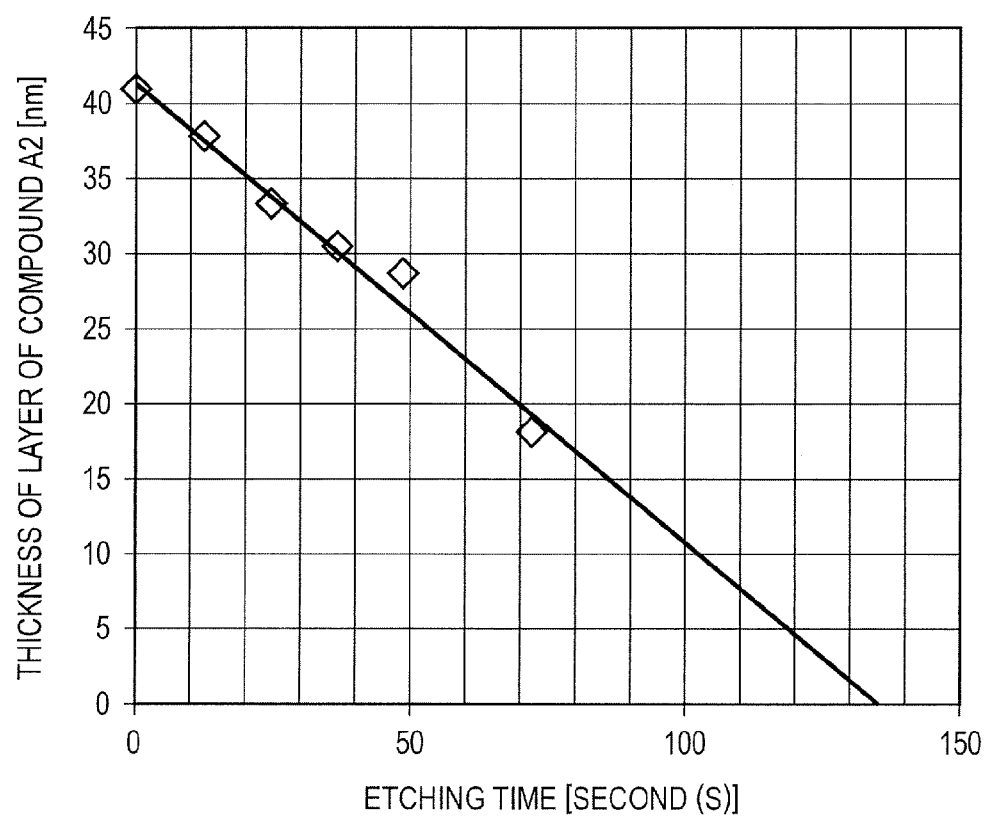
FIG. 9 is a graph showing a relationship between the total time of etching by the dipping method and the thickness of the sacrificial layer.

FIG. 9 is a graph showing a relationship between the total time of etching by the dipping method and the thickness of the sacrificial layer formed of the compound A2. It is to be noted that in the graph of FIG. 9, the compound A2 is used as a constituent material for the sacrificial layer 30 and a 60-wt % aqueous solution of IPA is used as a polar solvent. In addition, six plots shown in FIG. 9 represent pieces of data obtained by repeating the process based on the dipping method zero times, once, twice, three times, four times, and six times, respectively from the left. The thickness of the sacrificial layer was measured with a spectroscopic ellipsometer (HORIBA). As can be seen from FIG. 9, repeatedly performing the process based on the dipping method reduced the thickness of the sacrificial layer 30 by certain amounts each and the rate at which the sacrificial layer formed of the compound A2 was etched by the etching method was 3.7 nm/time. Therefore, it is found that repeating the process eleven or more times can remove the sacrificial layer 30 having a thickness of 40 nm. Although the graph shown in FIG. 9 is merely a specific example, the number of repetition of the process based on the dipping method can be decided by utilizing the quantitative tendency of the sacrificial layer 30 to reduce shown in FIG. 9. It is to be noted that when the sacrificial layer 30 is removed by employing the dipping method, the substrate 10 is preferably dried by rotating the substrate 10, or performing nitrogen blowing, in a subsequent step.

The residue to be removed is steadily reduced by performing the etching by the method described above at least twice and hence the residue of the water-soluble polymer layer provided on the upper layer of the sacrificial layer 30 can be removed from the organic EL display device together with the sacrificial layer 30. In addition, in the step, the concentration of the constituent material for the sacrificial layer 30 in a solution obtained by a second or subsequent contact between the sacrificial layer 30 and the polar solvent is preferably lower than the concentration of the constituent material for the sacrificial layer 30 in a solution obtained by a first contact therebetween. Further, the polar solvent to be used in a second or subsequent contacting step is preferably free of the constituent material for the sacrificial layer.

The kind of the solvent, composition of mixed solvents, and the like of the polar solvent to be used in the sacrificial layer-removing step are not limited as long as the etching rate of the solvent for the sacrificial layer is higher than its etching rate for the organic compound layer. For example, a mixing ratio between water and IPA may be adjusted for, for example, increasing the etching rate of the sacrificial layer relative to the organic compound layer. Thus, an end portion of the organic compound layer 22 (22a, 22b, 22c) produced in each sub-pixel unit after the organic compound layer-processing step becomes hardly soluble in the solvent. In addition, a solvent containing at least two kinds of compounds miscible with water and each having polarity can also be suitably used as the polar solvent in the present invention.

When the substrate 10 is lifted from the inside of the polar solvent after the sacrificial layer 30 has been removed by the method described in the foregoing, the sacrificial layer 30 alone can be removed while the shape of the organic compound layer 22 (22a, 22b, 22c) is maintained.

It is to be noted that after the removal of the sacrificial layer 30, the solvent remaining on the substrate 10 provided with the organic compound layer 22 or on the organic compound layer 22 is preferably removed by heating the substrate 10. The substrate 10 is more preferably heated under a vacuum condition at, for example, about 110° C. When the solvent is removed by heating the substrate 10 as described above, a charge injection layer or a charge transport layer can be formed in the next step in a state where the formation is not affected by the solvent. It is to be noted that the substrate 10 may be heated in a vacuum before the performance of the next step. The vacuum heating can also reduce an influence such as the adhesion of water, oxygen, or foreign matter in the atmosphere.

(9) Charge Injection/Transport Layer-Forming Step (FIG. 2O)

After the removal of the sacrificial layer 30, the charge injection/transport layer 24 is formed on the organic compound layer 22 (FIG. 2O). It is to be noted that the charge injection/transport layer 24 is preferably formed as a layer common to the respective sub-pixels. In addition, the manufacturing method of the present invention is a method suitable upon formation of a layer containing an alkali metal component or an alkaline-earth metal component as a charge injection layer.

When an electron injection layer is formed as the charge injection/transport layer 24, an electron injection material as a constituent material for the electron injection layer desirably has a high work function. Examples of such material include an alkali metal, an alkaline-earth metal, a material obtained by doping an electron transport material with an alkali metal, an alkali metal compound (oxide, carbonate, or halogenated salt), and an alkaline-earth metal compound (oxide, carbonate, or halogenated salt). Here, cesium, potassium, and lithium can be given as specific examples of the alkali metal. In addition, specific examples of the alkaline-earth metal include calcium and barium.

(10) Second Electrode-Forming Step (FIG. 2P)

When a top emission type organic EL display device is produced, the second electrode 25 corresponding to the upper electrode is a transparent electrode formed of a transparent conductive material. The transparent conductive material having light-transmitting property is preferably a material having a high light transmittance. Examples of such material include: transparent conductive materials such as ITO, indium zinc oxide, and ZnO; and organic conductive materials such as a polyacetylene. It is to be noted that a semitransmissive film obtained by forming a metal material such as Ag or Al into a film having a thickness of about 10 nm to 30 nm may be used as the second electrode 25. It is to be noted that the second electrode 25 is electrically connected to a switching element such as a transistor (not shown). As described above, the manufacturing method of the present invention is a manufacturing method without using a fine metal mask. Therefore, the manufacture of an organic EL display device having as fine a pixel size as about 10 μm and a large supporting substrate size in its fifth generation and afterward can be realized.

Driving Method of Organic EL Display Device

The organic EL display device manufactured by the manufacturing method of the present invention can be driven by applying a voltage between the first electrode 21 and the second electrode 25 which each sub-pixel (20a, 20b, 20c) has. Here, when the voltage is applied, for example, a power source unit (not shown) electrically connected to each electrode through a transistor is used.

Applications of Organic EL Display Device

As described above, the organic EL display device formed by the manufacturing method according to the present invention can find use in the display portions of various electronic instruments because the device is excellent in current efficiency, drive life, and fineness. Examples of the electronic instruments include digital cameras, portable instruments such as a personal digital assistant, personal computers, televisions, and various printers.

Figure 10:
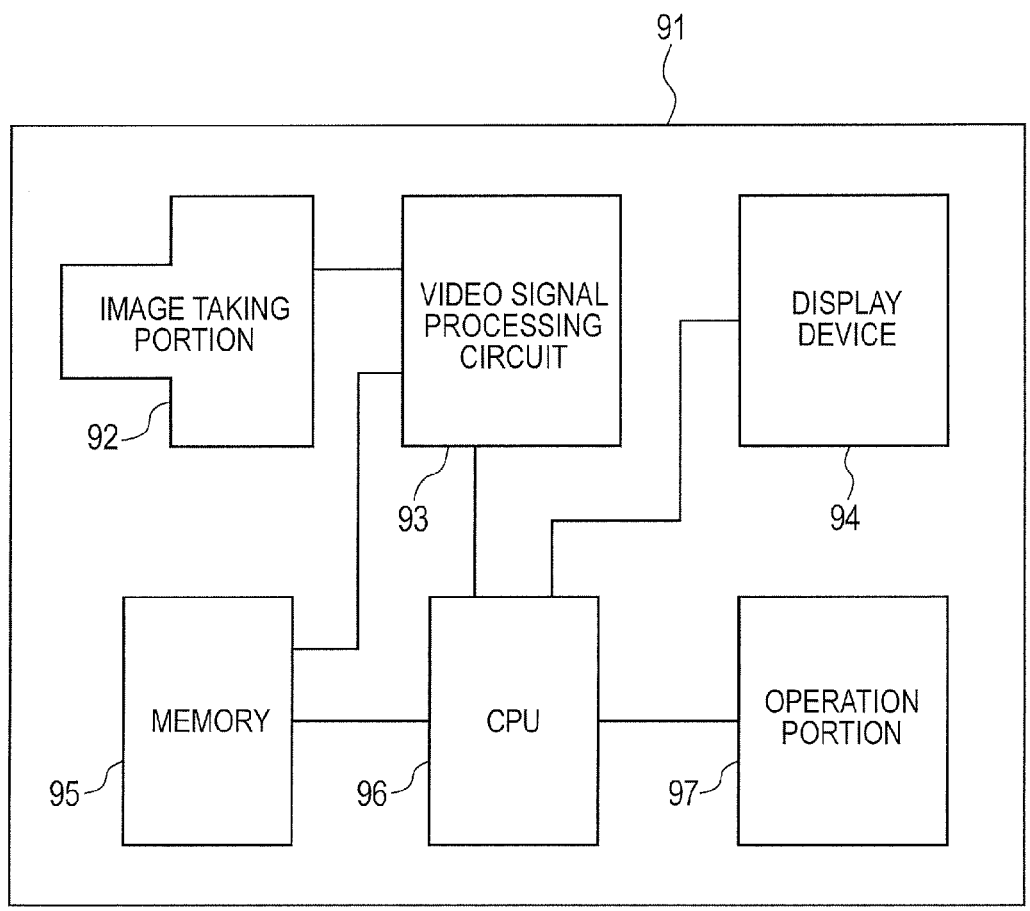
FIG. 10 is a diagram illustrating a block diagram of a digital camera system.

A digital camera as an example of the electronic instruments is described. FIG. 10 illustrates a block diagram of a digital camera system. A digital camera system 91 includes an image taking portion 92, a video signal processing circuit 93, a display device 94 according to the present invention, a memory 95, a CPU 96, and an operation portion 97. A video image taken by the image taking portion 92 or a video information recorded in the memory 95 is subjected to signal processing in the video signal processing circuit 93 so that a video signal may be produced. The video signal can be displayed on the display device 94. A controller has the CPU 96 for controlling, for example, the image taking portion 92, the memory 95, and the video signal processing circuit 93 with an input from the operation portion 97, and performs image taking, recording, reproduction, and display suitable for situations.

EXAMPLES

Next, the present invention is described by way of examples. However, the present invention is not limited to the examples to be described below regarding, for example, the order in which sub-pixels are formed in terms of their luminescent colors, and the construction and thickness of the organic compound layer. It should be appreciated that an example in which the examples to be described below are combined is also included in the present invention. It is to be noted that a well-known technology or a known technology in the art can be applied to a portion not specifically illustrated in the drawings or not specifically described in the following description.

Example 1

The organic EL display device illustrated in FIG. 1 was produced in accordance with the process illustrated in FIGS. 2A to 2P.

(1) First Electrode-Forming Step (FIG. 2A)

First, by a sputtering method, an aluminum alloy (AlNd) was formed into a film on the substrate 10 so that an AlNd film (reflective electrode) was formed. At this time, the thickness of the AlNd film was set to 100 nm. Then, by a sputtering method, ITO was formed into a film on the AlNd film so that an ITO film was formed. At this time, the thickness of the ITO film was set to 10 nm. It is to be noted that a stack formed of the AlNd film and the ITO film functioned as the first electrode 21. Next, the first electrodes (21a, 21b, 21c) included in the first sub-pixel 20a, the second sub-pixel 20b, and the third sub-pixel 20c, respectively were each formed by performing the patterning of the first electrode 21 based on a photolithography process (FIG. 2A).

(2) Blue Organic Compound Layer-Forming Step (FIG. 2B)

Next, the blue organic compound layer 22a was formed on the first electrodes (21a, 21b, 21c) and the substrate 10 by continuous film formation involving employing a vacuum deposition method.

First, a hole transport layer was formed so as to have a thickness of 120 nm, and then a blue-light-emitting layer containing a blue-light-emitting material was formed so as to have a thickness of 30 nm. Next, a fused polycyclic hydrocarbon compound represented by the following formula 1 was formed into a film so that a hole blocking layer was formed. At this time, the thickness of the hole blocking layer was set to 10 nm. Thus, the blue organic compound layer 22a was formed (FIG. 2B).

Formula 1

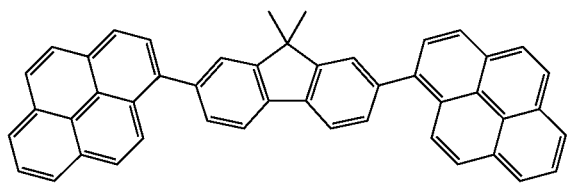

(3) Sacrificial Layer-Forming Step (FIG. 2B)

Next, a phenanthroline derivative represented by the following formula 2 was formed into a film by a vacuum deposition method so that the sacrificial layer 30 was formed. At this time, the thickness of the sacrificial layer 30 was set to 40 nm (FIG. 2B).

Formula 2

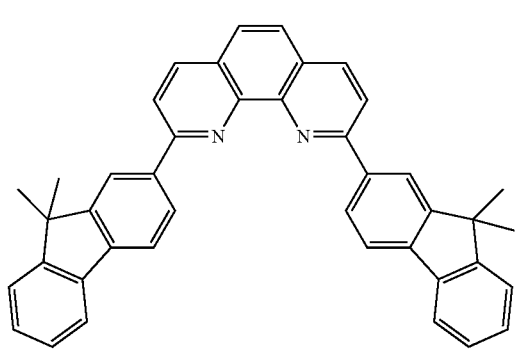

(4) First Intermediate Layer-Forming Step (FIG. 2C)

Next, a polyvinyl pyrrolidone (PVP, molecular weight: 360,000) as a water-soluble polymer material and water were mixed so that the weight concentration of the PVP became 5 wt %, to thereby prepare an aqueous solution of the PVP on the sacrificial layer 30. Next, the prepared aqueous solution of the PVP was applied onto the sacrificial layer 30 by a spin coating method and then dried to form the first intermediate layer 40. At this time, the thickness of the first intermediate layer 40 was 500 nm (FIG. 2C).

(5) Steps of Forming and Processing Photosensitive Resin Layer

Next, a positive photoresist (available under the product name "AZ1500" from AZ Electronic Materials) was formed into a film by a spin coating method so that the photosensitive resin layer 50 was formed (FIG. 2D). At this time, the thickness of the photosensitive resin layer 50 was 1,000 nm. Next, exposure to the ultraviolet light was performed with an exposure device (Mask Aligner MPA600 manufactured by Canon Inc.) and the photomask 60 having an opening in a region except a region where the first sub-pixel 20a was to be provided (FIG. 2E). At this time, an exposure time was 40 s. After the exposure, development was performed with a developer (prepared by diluting a product available under the product name "312MIF" from AZ Electronic Materials with water so that its concentration was 50%) for 1 minute. A photosensitive resin layer 52 exposed to the ultraviolet light 61 was removed by the developing treatment.

(6) Step of Processing First Intermediate Layer, Sacrificial Layer, and Blue Organic Compound Layer Next, the first intermediate layer 40 provided in a region not covered with the photosensitive resin layer 51 was removed by using the remaining photosensitive resin layer 51 as a mask and oxygen as a reactant gas under the conditions of a flow rate of 20 sccm, a pressure of 8 Pa, an output of 150 W, and 5 minutes.

Next, the sacrificial layer 30 not covered with the photosensitive resin layer 51 and the first intermediate layer 41 was removed by using each of the photosensitive resin layer 51 and the first intermediate layer 41 as a mask, and oxygen as a reactant gas under the conditions of a flow rate of 20 sccm, a pressure of 8 Pa, an output of 150 W, and a reaction time of 2 minutes. Thus, the patterned sacrificial layer 30 was formed in the region where the first sub-pixel 20a was to be provided (FIG. 2F). Next, the blue organic compound layer 22a provided in a region except the region of the first sub-pixel 20a was selectively removed by subjecting the blue organic compound layer 22a to dry etching under the same conditions as those for the sacrificial layer 30. Thus, the blue organic compound layer 22a was selectively formed in the region of the first sub-pixel 20a (FIG. 2G).

(7) Steps of Forming and Processing Red Organic Compound Layer

Next, the red organic compound layer 22b was formed by continuous film formation involving employing a vacuum deposition method. First, a hole transport layer was formed so as to have a thickness of 200 nm, and then a red-light-emitting layer containing a red-light-emitting material was formed so as to have a thickness of 30 nm. Next, the fused polycyclic hydrocarbon compound represented by the formula 1 was formed into a film so that a hole blocking layer was formed. At this time, the thickness of the hole blocking layer was set to 10 nm. Thus, the red organic compound layer 22b was formed.

Next, the phenanthroline derivative represented by the formula 2 was formed into the sacrificial layer 30 having a thickness of 40 nm by the same method as that of the step (3). Next, the first intermediate layer 40 having a thickness of 500 nm was formed by the same method as that of the step (4). Next, the positive photoresist used in the step (5) was formed into the photosensitive resin layer 50 by the same method as that of the step (5) (FIG. 2H). At this time, the thickness of the photosensitive resin layer was 1,000 nm. Next, the photosensitive resin layer 50 was processed by the same method as that of the step (5). Next, the first intermediate layer 40, the sacrificial layer 30, and the red organic compound layer 22b were processed in the stated order by the same method as that of the step (6). Thus, the red organic compound layer 22b was selectively formed in a region where the second sub-pixel 20b was to be provided (FIG. 2I).

(8) Steps of Forming and Processing Green Organic Compound Layer

Next, the green organic compound layer 22c was formed by continuous film formation involving employing a vacuum deposition method. First, a hole transport layer was formed so as to have a thickness of 160 nm, and then a green-light-emitting layer containing a green-light-emitting material was formed so as to have a thickness of nm. Next, the fused polycyclic hydrocarbon compound represented by the formula 1 was formed into a film so that a hole blocking layer was formed. At this time, the thickness of the hole blocking layer was set to 10 nm. Thus, the green organic compound layer 22c was formed.

Next, the phenanthroline derivative represented by the formula 2 was formed into the sacrificial layer 30 having a thickness of 40 nm by the same method as that of the step (3). Next, the first intermediate layer 40 having a thickness of 500 nm was formed by the same method as that of the step (4). Next, the positive photoresist used in the step (5) was formed into the photosensitive resin layer 50 by the same method as that of the step (5) (FIG. 2J). At this time, the thickness of the photosensitive resin layer was 1,000 nm. Next, the photosensitive resin layer 50 was processed by the same method as that of the step (5). Next, the first intermediate layer 40, the sacrificial layer 30, and the green organic compound layer 22c were processed in the stated order by the same method as that of the step (6). Thus, the green organic compound layer 22c was selectively formed in a region where the third sub-pixel 20b was to be provided (FIG. 2K).

(9) Step of Removing Photosensitive Resin Layer and First Intermediate Layer

Next, the photosensitive resin layer 51 was removed by performing dry etching with oxygen as a reactant gas under the conditions of a flow rate of 20 sccm, a pressure of 8 Pa, and an output of 150 W (FIG. 2L). Next, the first intermediate layer 41 was removed with flowing water (FIG. 2M).

(10) Sacrificial Layer-Removing Step

It is to be noted that the sacrificial layer 30 was removed with an aqueous solution having an IPA concentration of 60 wt %. Specifically, when a process (spin removal-spin washing) involving first dropping the 60-wt % aqueous solution of IPA onto the sacrificial layer 30, holding the resultant for 10 seconds, and then rotating the substrate 10 to shake off the aqueous solution of IPA and to dry the substrate 10 was defined as 1 cycle, the etching rate of 1 cycle was 6.7 nm. In consideration of etching unevenness, the cycle was repeated 7 times to remove the sacrificial layer 30 having a thickness of 40 nm (FIG. 2N). Next, the substrate 10 was rinsed with water and then the substrate 10 was dried by being rotated (spin washing). Next, the solvent remaining on the organic compound layer (22a, 22b, 22c) was removed by heating the substrate 10 at 80° C. in a vacuum. It is to be noted that the etching rate of the compound represented by the formula 1 as the constituent material for the uppermost layer (hole blocking layer) of the organic compound layer disposed in each sub-pixel with respect to the polar solvent used upon removal of the sacrificial layer 30 is sufficiently low as compared with the etching rate of the constituent material for the sacrificial layer 30 with respect thereto.

(11) Second Electrode-Producing Step and the Like

Next, the compound (compound A2) represented by the formula 2 was formed into a charge transport layer (electron transport layer). At this time, the thickness of the charge transport layer was set to 20 nm. Next, the compound represented by the formula 2 and cesium carbonate ($Cs_2CO_3$) were co-deposited from the vapor to form an electron injection layer. At this time, the thickness of the electron injection layer was set to 20 nm. It is to be noted that a stack formed of the electron transport layer and the electron injection layer functions as the common layer 24 (FIG. 2O).

Next, Ag was formed into the semitransparent second electrode 25 by sputtering (FIG. 2P). It is to be noted that the thickness of the second electrode 25 was set to 16 nm.

Next, sealing glass (not shown) was bonded to the substrate under a nitrogen atmosphere to provide a structure capable of preventing element degradation. The organic EL display device 1 of FIG. 1 was produced as described above.

An organic EL display device (hereinafter referred to as "organic EL display device of Comparative Example 1") was also produced in the same manner with the exception that the pattern of the respective organic compound layers (22a, 22b, 22c) was formed by vacuum-consistent film formation with a metal mask.

The organic EL display device 1 obtained in this example was evaluated for its performance together with the organic EL display device of Comparative Example 1.

Values obtained for the current efficiency and drive durability life of the device were comparable to those of the organic EL display device of Comparative Example 1. This may result from the following fact: the deposited film formed by the vacuum deposition method was used as the sacrificial layer 30, and hence the layer was able to be removed while the amount of the residue was reduced as compared with the PVP, and a reduction in efficiency and the degradation of the life were able to be avoided.

Example 2

An organic EL display device was obtained by the same method as that of Example 1 with the exception that the sacrificial layer 30 was removed by the following method in the step (10) of Example 1.

A process involving dropping an aqueous solution of IPA having an IPA concentration of 40 wt % onto the sacrificial layer 30, holding the resultant for 10 seconds, and then rotating the substrate 10 to shake off the aqueous solution of IPA and to dry the substrate 10 was repeated twice to wash the surface of the sacrificial layer 30. Next, when a process involving dropping an aqueous solution of IPA having an IPA concentration of 60 wt % onto the sacrificial layer 30, holding the resultant for 10 seconds, and then rotating the substrate 10 to shake off the aqueous solution of IPA and to dry the substrate 10 was defined as 1 cycle, the etching rate of 1 cycle was 6.7 nm. In view of the foregoing, the cycle was repeatedly performed 7 times to remove the sacrificial layer 30.

The resultant organic EL display device was evaluated by the same method as that of Example 1. As a result, the organic EL display device was found to have current efficiency, a drive life, and definition comparable to those of Example 1.

Example 3

An organic EL display device was obtained by the same method as that of Example 1 with the exception that the sacrificial layer 30 was removed by the following method in the step (10) of Example 1.

An etching rate when the step of dipping the substrate 10 in an aqueous solution of IPA having an IPA concentration of 60 wt %, which was obtained by mixing only IPA and water, for 10 seconds was performed once was calculated to be 3.7 nm from the relationship between the etching time and the thickness of the sacrificial layer shown in FIG. 9. In view of the foregoing, the step of dipping the substrate in the aqueous solution of IPA was repeated 11 times to remove the sacrificial layer 30. It is to be noted that after the sacrificial layer 30 had been removed, the substrate 10 was transferred to a water tank, dipped in and rinsed with water, and then dried by removing water on the substrate 10 through $N_2$ blowing.

The resultant organic EL display device was evaluated by the same method as that of Example 1. As a result, the organic EL display device was found to have current efficiency, a drive life, and definition comparable to those of Example 1.

Comparative Example 2

An organic EL display device was produced in the same manner as in Example 1 with the exception that the sacrificial layer 30 was removed as described below in the step (10) of Example 1. A 60-wt % aqueous solution of IPA was dropped onto the sacrificial layer 30, the resultant was held for 270 seconds, and then the aqueous solution of IPA was shaken off and the substrate 10 was dried by rotating the substrate 10. The resultant organic EL display device was evaluated by the same method as that of Example 1. As a result, the device showed current efficiency comparable to that of Example 1 but its drive life was remarkably short, specifically, about one tenth of that of Example 1.

Comparative Example 3

An organic EL display device was produced in the same manner as in Example 1 with the exception that in the step (10) of Example 1, the sacrificial layer 30 was removed by dipping the substrate 10 in an aqueous solution of IPA having an IPA concentration of 60 wt %, which was obtained by mixing only IPA and water, for 270 seconds.

The sacrificial layer 30 was removed by dipping the substrate 10 in the aqueous solution of IPA having an IPA concentration of 60 wt %, which was obtained by mixing only IPA and water, for 270 seconds. It is to be noted that after the sacrificial layer 30 had been removed, the substrate 10 was transferred to a water tank, dipped in and rinsed with water, and then dried by removing water on the substrate 10 through $N_2$ blowing.

The resultant organic EL display device was evaluated by the same method as that of Example 1. As a result, the device showed current efficiency comparable to that of Example 1 but its drive life was remarkably short, specifically, about one tenth of that of Example 1.

As described above, according to the present invention, it is possible to provide a method of manufacturing an organic EL display device including an organic EL element, which has element characteristics comparable to those of an organic EL element formed with a metal mask or the like in a vacuum in-situ fashion, while utilizing a patterning approach based on photolithography.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-147948, filed Jun. 29, 2012, which is hereby incorporated by reference herein in its entirety.

What is claimed is:

1. A method of manufacturing an organic electroluminescence display device having a plurality of organic EL elements each comprising a first electrode, a second electrode, and an organic compound layer disposed between the first electrode and the second electrode, in which the organic compound layer is patterned in a predetermined shape, the method comprising:

an organic compound layer-forming step of forming an organic compound layer on a first electrode;

a sacrificial layer-forming step of forming a sacrificial layer soluble in a polar solvent on the organic compound layer;

an intermediate layer-forming step of forming an intermediate layer comprising a water-soluble polymer on the sacrificial layer;

a processing step of patterning the sacrificial layer, the intermediate layer, and the organic compound layer;

a step of bringing the intermediate layer into contact with a liquid containing water to remove the intermediate layer and a layer provided above the intermediate layer; and a sacrificial layer-removing step of removing the sacrificial layer in the stated order, wherein the sacrificial layer-removing step comprises a step of performing a contacting step of bringing the sacrificial layer and the polar solvent into contact with each other a plurality of times.

2. The method of manufacturing an organic electroluminescence display device according to claim 1, wherein a concentration of a constituent material for the sacrificial layer in a solution obtained by any one of second and subsequent contacts between the sacrificial layer and the polar solvent is lower than a concentration of the constituent material for the sacrificial layer in a solution obtained by a first contact between the sacrificial layer and the polar solvent.

3. The method of manufacturing an organic electroluminescence display device according to claim 1, wherein the polar solvent used in any one of second and subsequent contacting steps is free of a constituent material for the sacrificial layer.

4. The method of manufacturing an organic electroluminescence display device according to claim 1, wherein the polar solvent comprises a mixed solvent of water, and a compound that is miscible with water and has polarity.

5. The method of manufacturing an organic electroluminescence display device according to claim 1, wherein the sacrificial layer-removing step comprises a step of bringing the sacrificial layer into contact with a mixed solvent having a different compositional ratio that differs for each contact.

6. An electronic instrument, comprising:

a display device;

a memory;

a CPU; and an operation portion, wherein the display device comprises an organic electroluminescence display device produced by the method of manufacturing an organic electroluminescence display device according to claim 1.

* * * * *